United States Patent
Chen et al.

(10) Patent No.: US 9,632,114 B2
(45) Date of Patent: Apr. 25, 2017

(54) DIGITAL CLOSED-LOOP FIBER OPTICAL CURRENT SENSOR

(75) Inventors: Xiangxun Chen, Beijing (CN); Jianbo Guo, Beijing (CN); Ping Jing, Beijing (CN); Shuo Chen, Beijing (CN); Shujie Yin, Beijing (CN); Zhanyuan Liu, Beijing (CN)

(73) Assignee: China Electric Power Research Institute, Beijing (CN)

( * ) Notice: Subject to any disclaimer, the term of this patent is extended or adjusted under 35 U.S.C. 154(b) by 1016 days.

(21) Appl. No.: 13/825,322

(22) PCT Filed: May 10, 2011

(86) PCT No.: PCT/CN2011/000816
§ 371 (c)(1),
(2), (4) Date: Jul. 24, 2013

(87) PCT Pub. No.: WO2012/037767
PCT Pub. Date: Mar. 29, 2012

(65) Prior Publication Data
US 2013/0278241 A1    Oct. 24, 2013

(30) Foreign Application Priority Data
Sep. 21, 2010   (CN) .......................... 2010 1 0288235

(51) Int. Cl.
*G01R 25/02*    (2006.01)
*G01R 15/24*    (2006.01)

(52) U.S. Cl.
CPC .................................. *G01R 15/247* (2013.01)

(58) Field of Classification Search
CPC ...... G01R 15/20; G01R 21/08; G01R 33/075; G05G 2009/04755; G06G 7/162
See application file for complete search history.

(56) References Cited

U.S. PATENT DOCUMENTS 4,994,663 A * 2/1991 Aoshima ................. G06E 3/005
250/214 R

* cited by examiner

*Primary Examiner* — Tung X Nguyen
(74) *Attorney, Agent, or Firm* — Platinum Intellectual Property LLP

(57) ABSTRACT

This present inversion provides a digital closed-loop fiber optical current sensor. The modulation signal of the optical wave "phase modulator" of the fiber optical current sensor system is modulation square wave, signal processing system extracts any harmonic wave of the photoelectric converter output modulation square waves, and extracts the measured current information from it. The preamplifier of signal processing system is transimpedance amplifier TIA, the bandwidth is extracted 1/650 instantaneous amplitude square wave directly from the modulation square wave (existing), thus the thermal noise of the preamplifier output and shot noise level is reduced to the existing technology of below 1/650; the current-voltage gain of transimpedance amplifier TIA does not depend on the feedback network resistance, thus it can have high current-voltage conversion gain and use low resistance in the feedback network TIA at the same time. So it can reduce resistance thermal noise to negligible that is accounted for a large proportion of TIA output noise.

8 Claims, 11 Drawing Sheets

DIGITAL CLOSED-LOOP FIBER OPTICAL CURRENT SENSOR

TECHNICAL FIELD

The present invention relates to sensitive electronics and sensor field in electronics information system, also to high voltage and high current field in electrotechnics, and particularly relates to a digital closed-loop fiber optical current sensor. The present invention also applies to digital closed fiber optical gyro, and various digital closed-loop fiber optic interferometers including digital closed-loop fiber optic Sagnac interferometer, and particularly sensor, gyro and interferometer that the output of extracted light signal is very weak.

BACKGROUND OF INVENTION

With the development of power system, the new techniques based on power electronics were more widely used in power system like DC transmission technology, flexible AC transmission technology, and digital substation technology and so on. In power system, the need is more urgent than ever before for practical optical current/voltage sensor (hereinafter referred to as fiber optical current sensor, optic PT). At present, the high potential end usually adopts electronic circuit active fiber optical current sensor, optic PT. The practical operation indicated that the fiber optical current sensor, optic PT exist safety problem, and should research the passive fiber optical sensor, optic PT for the high optional end.

Since the 60's of 20th century, lots of passive fiber optical current sensor concepts and designs were proposed. These concepts and deigns make use of the optical effects produced by current like magnetic energy, electric energy, heat energy, mechanical energy and so on, adjust amplitude of light (intensity), frequency, phase, polarization state. The effects applied included magnetic circular birefringence or magnetic rotation effect (polarization state) known as Faraday Effect, magneto-birefringent effect (polarization state) known as Cotton-Mouton Effect, magnetostrictive elasto-optical effect (phase), current thermal effect—heat up cold shrink effect—elasto-optica effect (phase), magnetostrictive—Bragg Diffraction Effect (frequency), current thermal effect and Rayleigh scattering, Raman scattering (intensity). Later, the focus was the Faraday Effect designs and concepts, and particularly the Faraday Effect fiber optical current sensor was gradually concentrated to the polarimeter and interferometer sensor two designs and concepts.

The method of the polarimeter fiber optical current sensor measuring determined the measured current is by measuring the intensity of two output lights the polarization plane perpendicular to each other, and determining the rotation angle of optical polarization plane produced by measured current, and then determining the measured current. This fiber optical current sensor related to linearly polarized light only. The optical loss and additional noise is tiny. The bandwidth of pre-amplifier need is identical to measured signal, e.g. 5 kHz. The signal processing circuit is simple. However, the signal processing circuit of this fiber optical current sensor accepts optical loss passively only, and can't interference its work (1980, several polarimeter closed-loop fiber optical current sensor were proposed, but they all were abandoned owing to slow response speed and large power consumption in principle, see literature [1, see IDS]). In 1966, University of Tokyo of Japan developed the "Laser Current Transformer" [2]. In addition, in 1978 china showed the "laser current sensor" developed by China Electric Power Research Institute at the National Science Conference Exhibition. And English and Chinese scholars joint developed fiber optical double beams, four output lights complex system [3], and ABB firm developed bulk optical media-fiber optical transmission double beams, four outputs polarimeter fiber optical current sensor[4]. None of them can solve precision and long-term stability problem due to environment temperature, vibration induced birefringence.

Considering above case, the relevant scholars proposed a phase modulation Sagnac interferometer fiber optical current sensor [6], [7], which is based on existing Sagnac interferometer fiber optical current sensor, and referred to digital closed-loop fiber optic gyro military technology. As FIG. 1 showed, in this design scheme, except for sensor fiber circle, the transmission lights are same amplitude, and the polarization plane perpendicular to each other two linear polarization lights; each light passes a 45° λ/4 wave plate and convert two same amplitude and reversed direction rotation circular polarization lights, then enter sensor fiber circle. The Larmor precession, which is produced by measured current in the sensor fiber circle, cause a different frequency shift of circular polarization lights that enter sensor fiber circle and its rotation direction is identical and reversed to electron precession direction, and leads to the phase difference of two circular polarization lights (The Faraday Effect derived from this). The two circular polarization lights, which come from sensor fiber circle pass through the 45° λ/4 wave plate again and return the transmission light path, restore to polarization plane perpendicular to each other two linear polarization lights, and the phase difference of circular lights becomes that of linear lights. Those produce interference with the polarizer that is 45° angle with the two linear polarization lights. Therefore, the measurement of the current magnate field is become the measurement of the phase of linear light, and this can achieve by the mature interference technology because the precise measurement of the phase of light wave is much easier than that of polarization state [8]. In theory, this fiber optical current sensor is more precise than common polarimeter fiber optical current sensor. Because linear polarization phase is easy to feedback voltage light wave phase modulator, so this fiber optical current sensor is easy to realize digital closed-loop, and benefit to improve system stability and the measurement precision.

The digital closed-loop Sagnac interferential fiber optical current sensor attracted many attentions as proposed, and lots of companied and corporations began to develop it [9-19]. In china, China Electric Power Research Institute, Beihang University, Department of Space and other units have also joined in this research. But there are some problems of this kind of fiber optical current sensor, that polarization model of optical fiber current sensor does not.

First, this kind fiber optical current sensor used λ/4 wave plate to realize the wave polarization state conversion, linear polarization—circular polarization—linear polarization. This leads some problems. At present, the λ/4 wave plate usually was made of a kind of high birefringent fiber with 90° phase difference of its fast and slow axis. But this fiber phase delay temperature coefficient is larger, about $2 \times 10\text{-}4/°C$. usually. Therefore, the delay phase of this λ/4 wave plate will deviate 90° due to the temperature change. It cannot realize the wave polarization conversion of linear polarization-circular polarization-linear polarization. This leads the modulation efficiency of the light signal [8],[10] (see U.S.

Pat. No. 5,987,195), and change the ratio of the fiber optical current sensor, and increase the noise signal (see U.S. Pat Nos. 7,038,718, 5,987,195).

Second, the light path phase modulation and the signal processing of the circuit are both dependent on square wave closed-loop strategy. This reduced the measurement precision in the tiny signal range, also narrowed its dynamic range, slowed down the response speed of the fiber optical current sensor. Different from the polarization fiber optical current sensor, the closed-loop fiber optical current sensor processed the square wave carrying signal information instead of the optical signal with the similar waveform; and mixed strong peak spikes caused by square wave modulation (see U.S. Pat. Nos. 5,684,591, 5,280,339). Because the phase difference of two circular polarized lights induced by measured current magnetic field was small, the square wave amplitude of the signal current was nanoampere level only when the total output optical current was microampere level. But the bandwidth of the amplitude modulation square wave was very wide. E.g. when the bandwidth of the signal was 5 kHz, the bandwidth of the amplitude modulation square wave was 6 MHz above at least. It is the 1200 times than that of the polarimeter fiber optical current sensor under the same condition. Only this point, under the same output noise current density condition, the noise power level of output signal of the preamplifier of the digital closed-loop fiber optical current sensor was 1200 times than that of the polarimeter fiber optical current sensor. For this reason, this kind of fiber optical current sensor not only detected the square wave amplitude, produced the feedback stepped slope wave, modified feedback gain and other digital closed-loop calculations, and also need to carry out a large amount of noise reduction calculations. Moreover, noise point data results were associated with large amounts of data before and after this point the (in theory, should be associated with global data). Therefore, the delay time (not the calculation time associated with the device operation speed) of the method was long, and its response speed was slow. And the latest U.S. patent "Optical sensor, optical current sensor and optical voltage sensor" (application number: 20090212763) considered "it is difficult to improve the response speed" as one of the problems of this kind fiber optical current sensor.

For the λ/4 wave plate phase delay change with the temperature, we can use our designed zero temperature coefficient optical fiber wave plate to solve this problem. For details, see our pending patent "zero temperature coefficient of the optical wave plate and polarization state converter". The present patent is to solve the second problem above mentioned.

SUMMARY OF THE INVENTION

Figure 1:
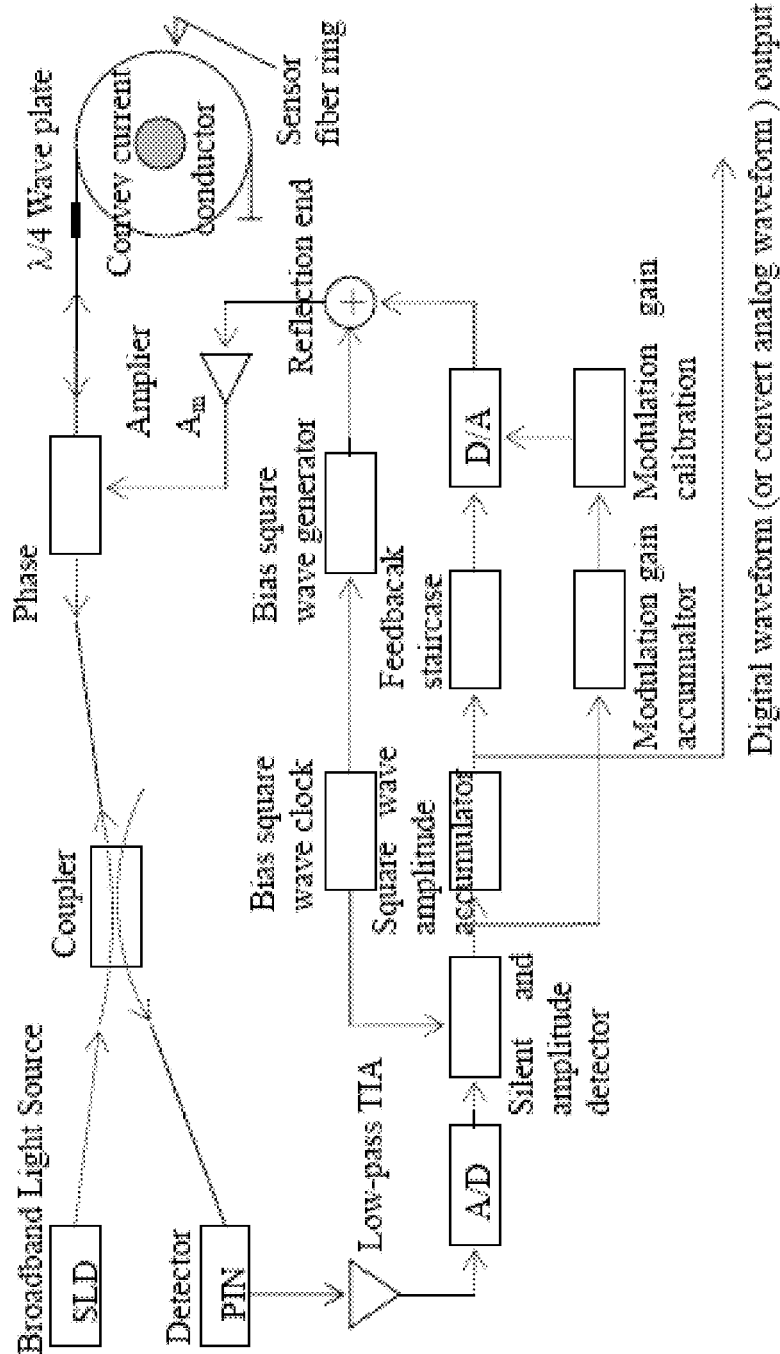
FIG. 1 is the simplified circuit and optical path diagram of the existing square wave modulation-square detection model digital closed-loop fiber optical current sensor.

The main objective of this present invention is: to reduce the noise power level of the digital closed-loop fiber optical current sensor, to improve the bandwidth, sensitivity and the dynamic range of the digital closed-loop fiber optical current sensor.

This present invention provides a digital closed-loop fiber optical current sensor. The modulation signal of the optical wave "phase modulator" of said the fiber optical current sensor system is modulation square wave, signal processing system extracts only any harmonic wave of the photoelectric converter output modulation square waves, and extracts the measured current information from it:

Wherein the optical path consists of:

A broadband light source, the output light of the source passes through the polarizer and becomes a low coherence length of the linear polarized light;

An integrated waveguide type optical phase modulator, its function is to adds positive, negative 90° bias phase to the existing linear polarized light, and the its period is set already, and the feedback phase opposite to existing light wave phase;

At least one polarization-maintaining fiber delay line, and its role is to enable the linear polarized light produces required delay after passing through the delay line, to extract current information to be measured from the interferometer output signal;

At least one wave plate, which makes two linearly polarized lights that their polarization directions are perpendicular to each other produce the λ/4 wave plate with 90° phase difference. The angle between fast axis directions of the wave plate and fast axis directions of polarization-maintaining optical fiber delay line is 45°, and its role is to make the linearly polarized beams from the polarization-maintaining fiber delay lines perpendicular to each other converts into a left circularly polarized light and right circularly polarized light through the wave plate, and make the left, right circularly polarized light in the opposite direction pass through the plate and then restore into the two linear polarization direction perpendicular polarized lights;

At least one single turn fiber ring or multi fiber ring surround the conductor that will transmit the measured current, its role is to enable the left, right circularly polarized light through the optical fiber ring in the measured current magnetic field generate phase difference θC in accordance with Faraday effect. And then convert θC into the difference θL between two linearly polarization direction perpendicular polarized lights after the left, the right circularly polarized light back through the λ/4 fiber wave plate, and the θL=θC;

Wherein the circuitry consists of:

A photoelectric converter, its effect is to convert the light phase by phase modulation type optical signal affected by the φs, φb and φf together to amplitude modulation square wave electric signal only affected by φS, in which φS is the signal phase generated by the current to measure, φb is phase modulator generates a bias phase, and φf is feedback phase;

A transimpedance amplifier TIA, its effect is covert photodetector output low signal-to-noise ratio of the weak current signal to voltage signal that drives subsequent A/D conversion circuit of high signal-to-noise ratio. Which is characterized in that the feedback network is not low pass filter network in the prior art, but the band-stop filter network; the output voltage waveform is not the low SNR amplitude square wave in the prior art, but high SNR sine wave of a harmonic on behalf of amplitude modulation square wave. Therefore, can extent the small signal region linear of digital closed-loop fiber optic current sensor.

A digital feedback phase circuit and phase of light wave feedback loop for square wave amplitude detection, square wave amplitude accumulative, and feedback stepped ramp formation mainly, its role is to offset light wave phase changes induced by the measured current. Which is characterized in that square wave amplitude is determined by the amplitude of the digital sine wave modulation with high signal-to-noise ratio, rather than the amplitude of the digital sine wave modulation with low signal-to-noise ratio like the existing technologies. It can avoid the existing a lot of noise reduction operation technology required, improve the response speed of the closed-loop fiber optical current sensor;

A modulation gain control loop, which consist of modulation gain accumulation and modulation gain calibration, its role is to adjust the gain of said light wave phase feedback loop when feedback phase flyback error occurs, to ensure the feedback phase flyback error zero;

An integrated waveguide type optical phase modulator, its function is to add positive, negative 90° bias phase to the existing linear polarized light, and the its period is set already, and the feedback phase opposite to existing light wave phase;

A bias square wave forming circuit, and its role is to add positive, negative 90° bias phase period set already to existing light wave phase by the integrated waveguide type optical phase modulator, and convert the phase modulation type optical signal into the amplitude modulation square wave signal after passing through photoelectric conversion.

Wherein the center frequency of amplitude sine wave of transimpedance amplifier TIA output is the fundamental frequency of said modulated square wave.

Wherein the center frequency of amplitude sine wave of transimpedance amplifier TIA output is the harmonic frequency of said modulated square wave.

Wherein transimpedance amplifier TIA comprises a high gain amplifier A, a photoelectric converter as the main component of the input circuit, and a bandstop filter feedback network BSF. Which connects the A reverse input end and output end of aid BSF. The output signal of said TIA is removed from the output of the A, the signal can be directly used for the subsequent signal processing, also be further amplified and then carry out signal processing.

Wherein transimpedance amplifier TIA band-stop filter of the feedback network is composed of the first branch 1, and the second branch 2 in parallel.

Wherein the first branch 1 of transimpedance amplifier TIA band-stop filter of the feedback network is composed of the resistor RLand inductance L in series, and the second branch 2 is composed of the resistor RC and capacitor C in series.

Wherein the first branch 1 of transimpedance amplifier TIA band-stop filter of the feedback network is composed of the resistor RLand inductance L in series, and the second branch 2 is composed of capacitor C.

Wherein the first branch 1 of transimpedance amplifier TIA band-stop filter of the feedback network is composed of the inductance L, and the second branch 2 is composed of the resister Rc and capacitor C in series.

Wherein transimpedance amplifier TIA band-stop filter of the feedback network is composed of n difference center frequency band-stop filters in series.

Wherein the highest frequency of TIA has nothing to do with the TIA current-voltage conversion gain, which can improve the current—the TIA voltage conversion gain without reducing its highest working frequency.

Wherein TIA current-voltage conversion gain does not depend on the resistance of the TIA feedback network, thus it can have high current-voltage conversion gain and use low resistance in the feedback network TIA at the same time. It can reduce resistance thermal noise that had a large proportion of TIA output noise to negligible degree.

This present invention provides a method to adjust a transimpedance amplifier TIA bandwidth. Adjust said feedback resistance value in network can adjust the corresponding transimpedance amplifier TIA bandwidth, and can keep the requirements of the current-voltage conversion gain.

This present invention provides a method to adjust a transimpedance amplifier TIA bandwidth. By changing are described said transimpedance amplifier TIA bandwidth by changing the center frequency differences of band-stop filter in series—parallel of multi-RLC string connected, and to maintain the current-voltage conversion gain.

The advantages of this present invention are described as below:

(1) The main noise power level of the preamplifier TIA for optical receiver of the digital closed-loop fiber optical current sensor, namely noise power is proportional to the thermal noise power level of the bandwidth and of the shot noise. The noise power level is reduced to 1/650 below of existing technology required TIA, which can greatly improve the sensitivity, dynamic range, time domain response speed or bandwidth of the digital closed-loop fiber optical current sensor.

(2) The current-voltage conversion gain of the preamplifier TIA for optical receiver of the digital closed-loop fiber optical current sensor does not depend on its resistance of the TIA feedback network. Therefore, it cannot adopt resistance, or low resistance, and the resistor thermal noise is negligible. In contrast, the existing techniques required TIA must increase the resistance of the feedback net work to increase the current-voltage conversion gain. So the thermal noise of the resistor have a large proportion of the output noise in the existing techniques required TIA.

(3) The operation frequency of the signal processing system of the digital closed-loop fiber optical current sensor is not affected by the current-voltage conversion gain. Therefore, improving current-voltage conversion gain of the system will not affect the highest work frequency of the system. In contrast, improving the current-voltage conversion gain of the existing techniques will decrease its highest work frequency of the system, proportionally.

(4) The bandwidth of the digital closed-loop fiber optical current sensor is not affected by the current-voltage conversion gain. Therefore, improving current-voltage conversion gain of the system will not affect the system bandwidth. In contrast, improving the current-voltage conversion gain of the existing techniques will decrease its system bandwidth, proportionally.

(5) The bandwidth of the digital closed-loop fiber optical current sensor can be changed by adjusting the resistor of the TIA feedback network, but it will not change the current-voltage conversion gain of the digital closed-loop fiber optical current sensor. In contrast, the current-voltage conversion gain of the existing digital closed-loop fiber optical current sensor will increase or decrease with the resistor of the TIA feedback network.

DETAILED DESCRIPTION OF EMBODIMENTS

The detail of the embodiments is described as below incorporated with the figures by way of cross-reference.

In order to improve the dynamic range and the response speed of the digital closed-loop fiber optical current sensor, the noise power level of the preamplifier output signal of the signal processing system can be reduced. It not only increases the measurement accuracy in the tiny signal range, but also deceases the lag time of signal process. The solution of the present invention provided is described as below: wave phase modulation adopted square wave, signal processing did not us square wave but based on the sine wave (Hereafter referred to as the square wave—sine wave scheme). In order to explain why this design can achieve the goal, the application first analyze the characteristics of the signals need to process of the digital closed-loop fiber optical current sensor.

As a example, the FIG. 1 is the simplified circuit and optical path diagram of the existing square wave modulation-square detection model digital closed-loop fiber optical current sensor (see: U.S. Pat. No. 5,914,781 and other publications.). In this figure, "the low-pass TIA" was a transimpedance amplifier (TIA) technology current-voltage conversion type low-pass preamplifier, the polarizer (analyzer), depolarizer, delay line et cetera did not draw up. The phase offset square wave amplitude Up that produced 7/2 phase shift was an identical The determined integrated waveguide phase modulator produced an identical constant, and it had nothing to do with the measured signal, and the square wave period T was determined by the optical path and had nothing to do with the measured signal. The output current wave of the detector PIN (i.e. a photoelectric converter) was identical to the signal optical. It was modulation square wave of the instantaneous amplitude Um(t)=Up·i(t), in which i(t) was the measured current. The objective adopting closed-loop was to generate and track the adjusted feedback signal according to the change of i(t), and then to force the system output signal to zero. The digital feedback signal was staircase signal corresponding to Serrodyne modulation that was determined by the various moments of the square wave amplitudes. The work of the digital closed-loop was to generate right staircase square wave feedback phase, and its phase back zero when the staircase square wave phase was more than $2\pi$, then generate next staircase square wave. When the phase flyback, the PIN, the preamplifier, A/D, square amplitude detector, et cetera may produce phase error, so must adjust staircase amplitude according to the phase error. The function was realized through the modulation gain accnmulation and modulation gain calibration links.

In the existing square wave solutions are that conversing the output amplitude modulation square wave light current of the PIN to the amplitude modulation square voltage by the low-pass TIA, and then extracting the instantaneous amplitude modulation from the amplitude modulation square wave voltage signal.

However, FIG. 1 shows that regardless of the method, as long as the square wave amplitude analyzer in the figure analyze the amplitude of the amplitude modulation square wave correctly, the later signal processing part can work in the same way. The existing technique can realize the same digital closed-loop function that above system carried out. So do not have to use the low-pass TIA.

The following will explain why the digital closed-loop function of the fiber optical current sensor only depended on the amplitude of the amplitude modulation square wave, and why this present invention provided solution can analyzed the amplitude of the amplitude modulation square wave, improve the signal-to-noise of output signal of the preamplifier of the he signal processing system.

For the common fiber interferometer sensor, the photoelectric output current I(t) of the photoelectric converter can be expressed as (T. Giallorenzi, J. Bucaro, A. Dandridge, G. Sigel, et al., Optical Fiber Sensor Technology [J], IEEE Trans. MTT, 1982, 30(4): 472-511):

$$I(t)=I0[1+\alpha\cdot\cos(\phi s(t)+\phi f(t)+\phi b(t))] \quad (1)$$

In which the I0 is proportional to the system input optical power, a is a coefficient related to optical decay and optical modulation efficiency, $\phi s(t)$, $\phi b(t)$, $\phi f(t)$ are the phase difference or compensation phase difference of measured signal s, offset modulation signal sb, feedback signal sf by two different propagation path (or patterns) lights. Under the FIG. 1 shown digital closed-loop condition, the offset phase $\phi b(t)$ was positive, negative square wave of $\pi/2$ amplitude, 1 duty factor, T period. The positive, negative square wave adding on the electro-optic modulator generate square wave voltage. To simplify the analysis, make alpha=1, here the corresponding I(t) were when $\phi b(t)=\pi/2, -\pi/2$ respectively:

$$I+(t)=I0[1+\cos(\phi s(t)+\phi f(t)+\pi/2)]=I0[1-\sin(\phi s(t)+\phi f(t))](0\leq T\leq T/2) \quad (2)$$

$$I-(t)=I0[1+\cos(\phi s(t)+\phi f(t)-\pi/2)]=I0[1+\sin(\phi s(t)+\phi f(t))](T/2<t\leq T) \quad (3)$$

Without the feedback signal $\phi f(t)$, I+(t), I−(t) were:

$$I+(t)=I0[1-\sin(\phi s(t))](0\leq t\leq T/2) \quad (4)$$

$$I-(t)=I0[1+\sin(\phi s(t))](T/2<t\leq T) \quad (5)$$

It is indicated that output interference signal was the positive, negative amplitude sin $\phi$ square wave added to direct current I0. The square amplitude reflected the size of $\phi s$, i.e. measured signal size because the expression equation of I±(t) was derived from $\cos(\phi s\pm\pi/2)=\mp\sin\pi/2\cdot\sin\phi s$. In which, $\pm\sin\pi/2$ represents the amplitude of 1 flat positive, negative square wave p0(t), sin $\phi s(t)$ represents modulation on the flat positive, negative square wave amplitude. In order to meet the requirement of measurement accuracy, the sin $\phi s(t)$ works in the sin $\phi s(t)\approx\phi s(t)$ linear segments according to the design, i.e. in φs(t)<<1 arc range. So the measured signal carried information was in the amplitude of the positive, negative square wave, measuring the instantaneous amplitude of the positive, negative square wave, the measured signal was determined.

For the fiber optical current sensor in FIG. 1, φs(t)= 4NV·i(t), in which, N is the number of turns of the fiber optical sensor, V is Verdet constant fiber, i(t) is the current to be measured. The amplitude of sin φs≈φs(t) positive, negative square wave pφ(t)=φs(t)·p0(t) can be expressed as:

$$P\varphi(t) = \varphi s(t) \cdot \left[ \sum_{n=1}^{\infty} \frac{1}{2n-1} \sin((2n-1)\omega_0 t) \right] \quad (6)$$

In which, ω0=2π f0, f0=1/T and f0 is the fundamental frequency. It is showed that pφ(t) consists of a series of (1/(2n−1))sin((2n−1)ω0t) as the carriers, φs(t) the modulation signal amplitude modulation waves. Each amplitude modulation wave carried Pφ(t) amplitude φs(t) information. So making use of any amplitude modulation (such as the fundamental wave) of pφ(t) only, can correctly detect the amplitude of the amplitude modulation square wave. Since each amplitude modulation bandwidth is that of φs(t) (also known as bandwidth of i(t)) two times of Wi, the center frequency was (2n−1)f0 respectively. In the existing solution, extract the modulation square wave amplitude using low-pass preamplifier the output square wave waveform. On the condition of f0=500 kHz, Wi=5 kHz, even if only using before 7 modulation square waves to recovery the Pφ(t) approximately, the low-pass preamplifier bandwidth was 6.5 MHz above at least. In contrast, when using one modulated wave extract the amplitude modulation square wave, the preamplifier bandwidth was only 10 kHz. It was the 1/650 less than existing solution. Only by this point, the preamplifier noise power level is proportional to the bandwidth of the thermal noise and the shot noise (shot noise) level, reduce to the existing scheme of 1/650. This is the principle of the present patent application how to use amplitude modulation sine wave to extract the amplitude of the modulation square wave, to greatly improve the preamplifier output signal to noise ratio of the signal processing system, and then improve he dynamic range of the system and the response speed.

Figure 2A:
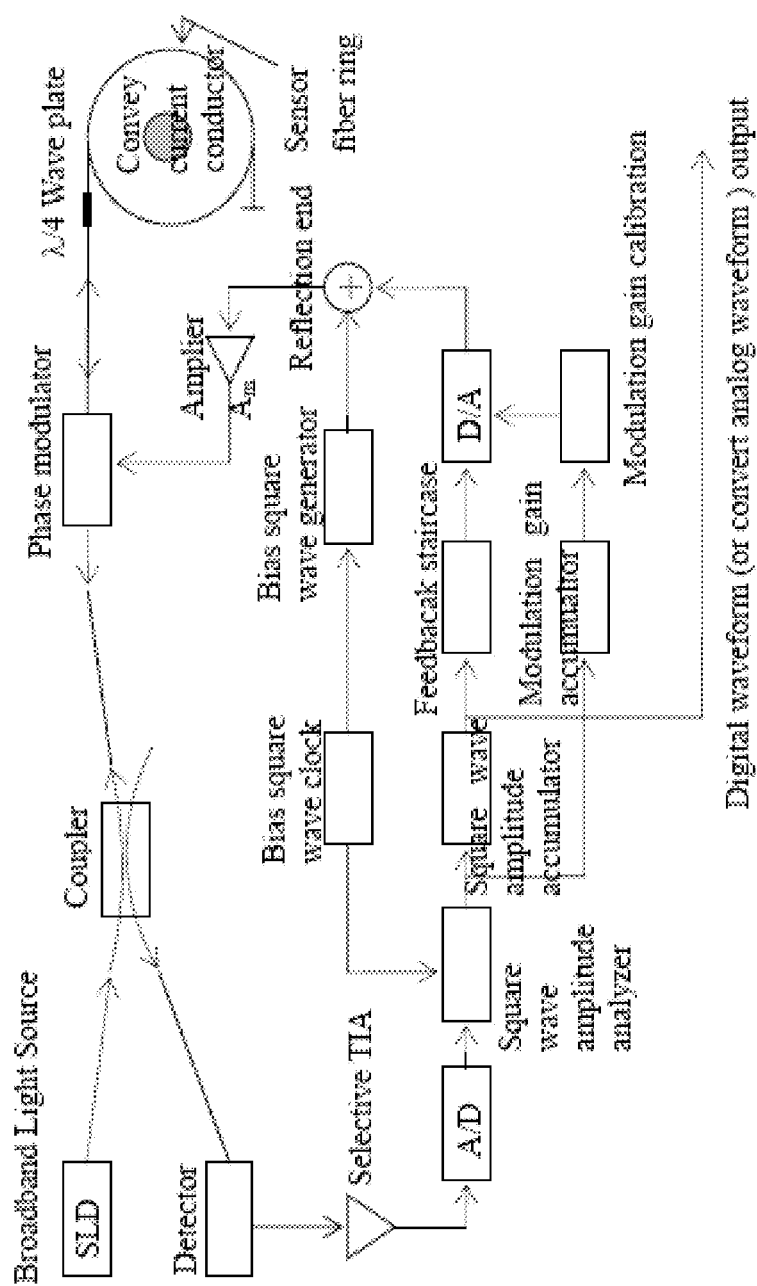
FIG. 2(*a*) is the implementation schematic diagram of the present invention square-sine wave combined reflective digital closed-loop fiber optical current sensor, and FIG. 2(*b*) is the implementation schematic diagram of the present invention square-sine wave combined loop type digital closed-loop fiber optical current sensor.
Figure 2:
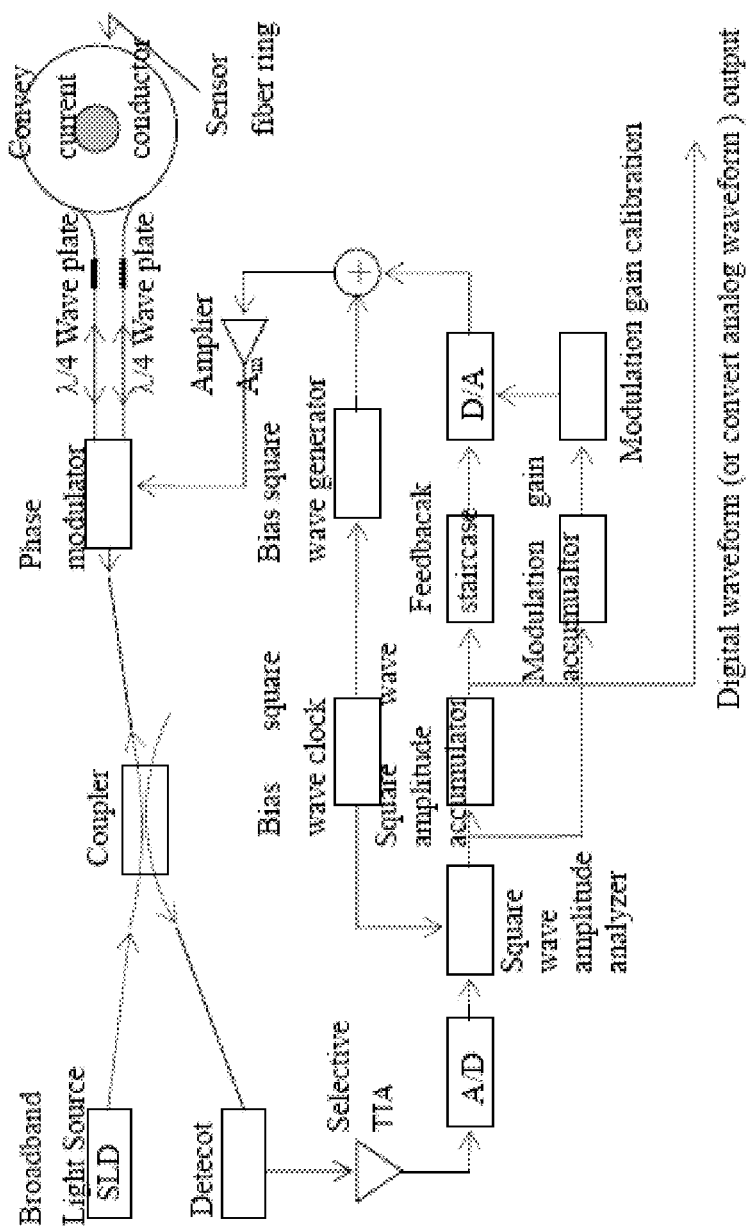
Figure 3:
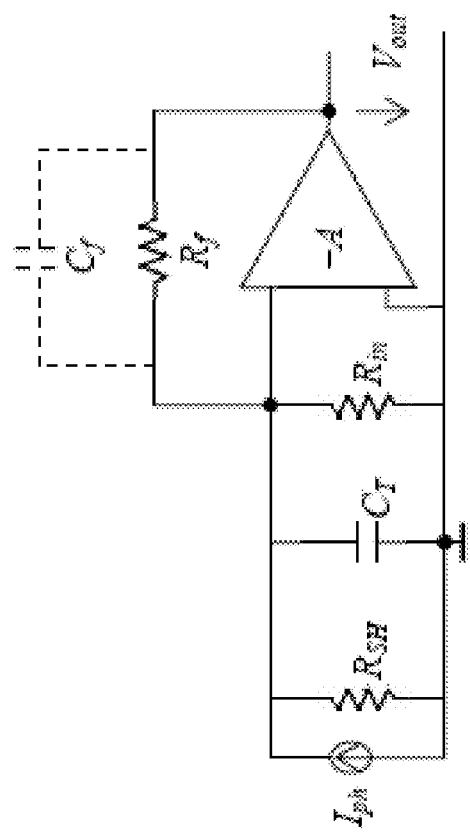
FIG. 3 is the basic structural diagram of the tansimpedance amplifier (hereinafter referred to as TIA) employed in the existing technique.
Figure 4:
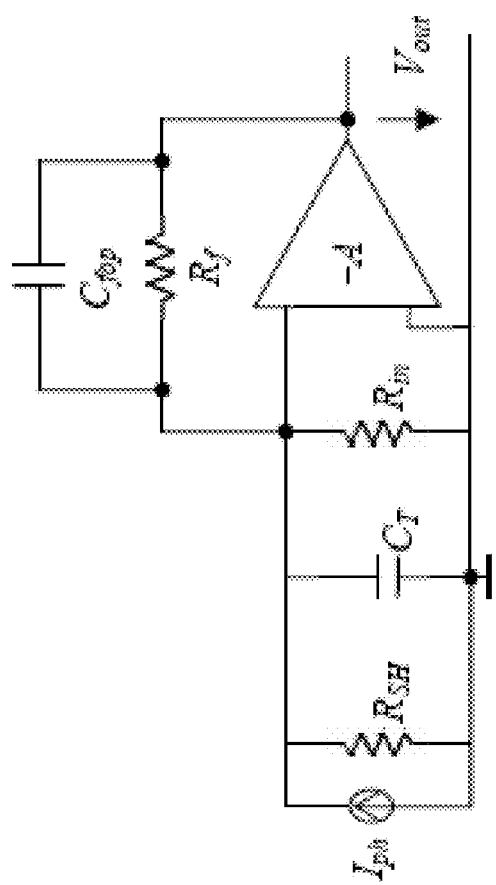
FIG. 4 is optimum structure schematic of the existing technique feedback capacitance type TIA, and its aim is to make TIA work stably, did not cause oscillation due to noise voltage.
Figure 5:
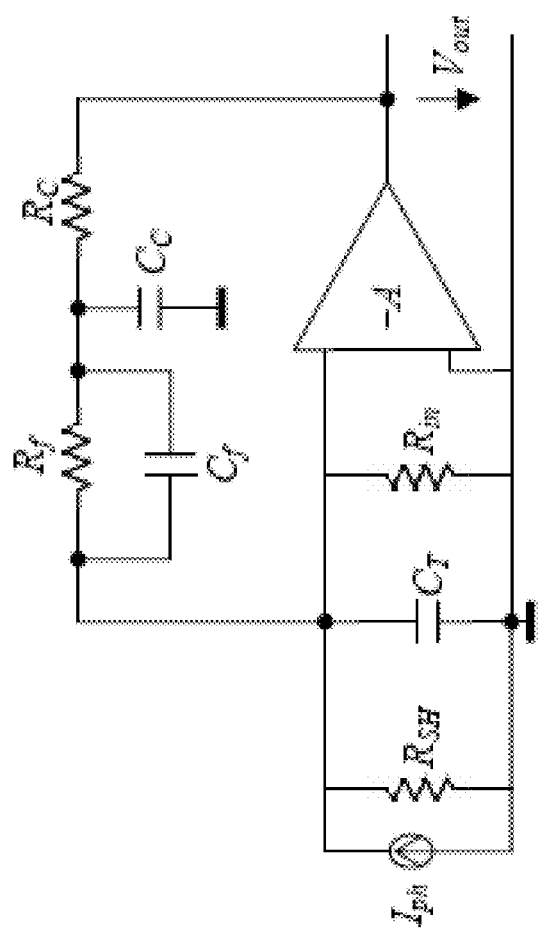
FIG. 5 is structure schematic of the existing technique R-C compensation feedback network TIA, and its aim is to reduce the feedback capacitance effect for the TIA bandwidth and noise performance.
Figure 6:
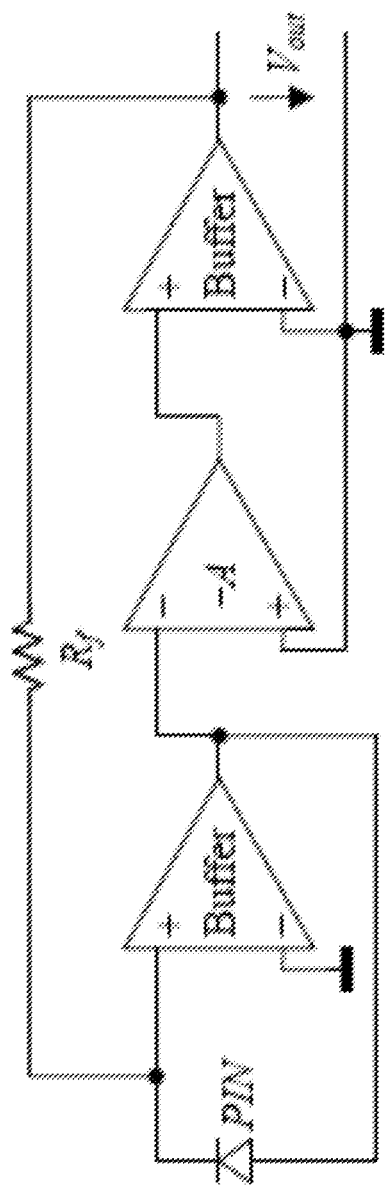
FIG. 6 is structure schematic of the existing technique bootstrap input TIA, and its purpose is to reduce the PIN capacitance effect for the TIA bandwidth and the noise performance, in which the voltage gain of the buffer is 1.

FIG. 2 is the implementation schematic diagram of the present invention square-sine wave combined reflective digital closed-loop fiber optical current sensor. In the diagram, preamplifier for optical receiver is no longer a low-pass TIA using in existing digital closed-loop fiber optic current sensor, but the selective amplifier that only amplifying the selected frequency band signal.

Figure 7:
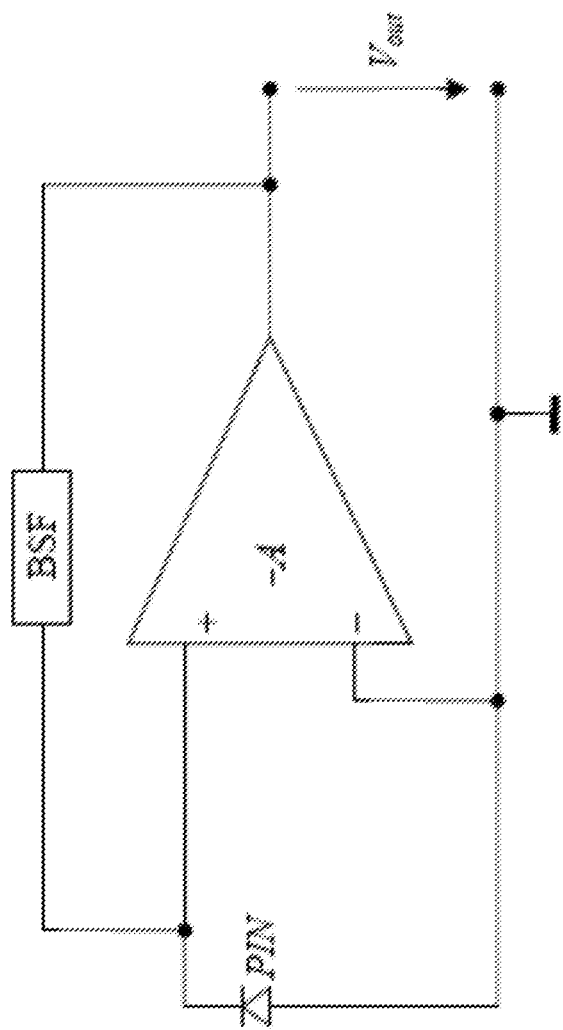
FIG. 7 is the basic structure schematic of the present invention TIA.
Figure 8:
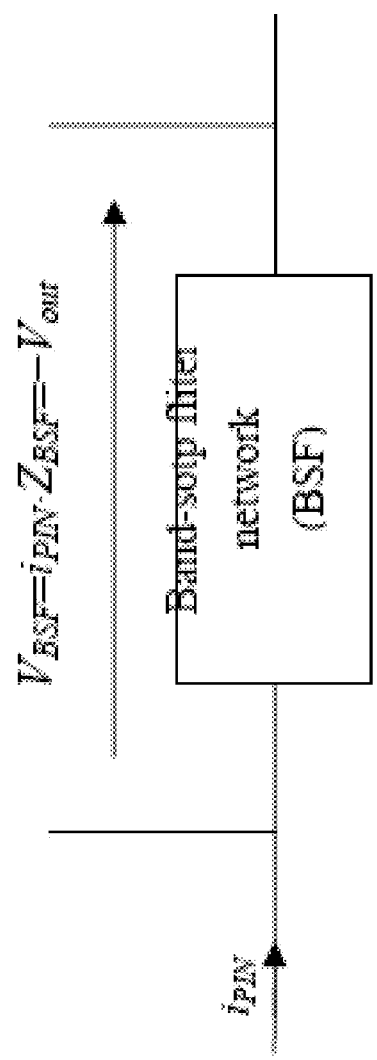
FIG. 8 is the relationship diagram between the TIA band-stop filter feedback network input current and the output voltage of the present invention, in which the ZBSF is the current-voltage conversion gain of TIA, and the gain value is written Z0 when it is the center the frequency of the feedback network.
Figure 9:
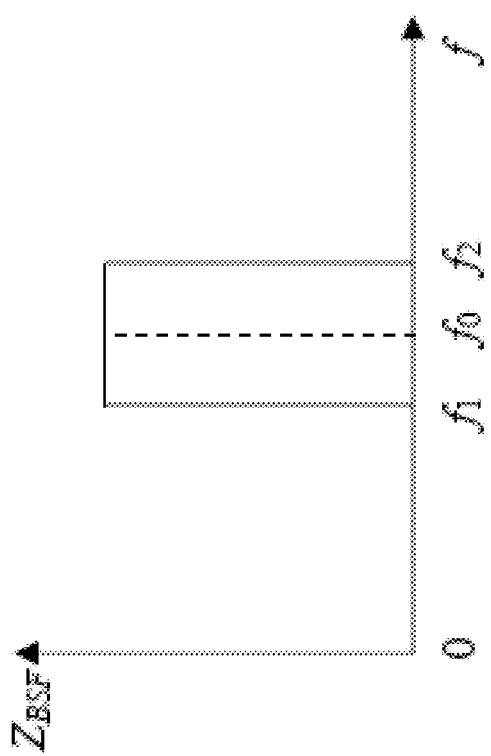
FIG. 9 is characteristic diagram of the ideal impedance (i.e. the current-voltage conversion gain) of the present invention TIA feedback network.

FIG. 7 is the general structure of the embodiment of selective amplified TIA, the relationship between the input current and the output voltage of the band stop filter (band-stop filter:BSF) feedback network is shown in FIG. 8, the ideal impedance of the feedback network (i.e. current-voltage conversion gain) characteristics is shown in FIG. 9.

According to circuit theory, i TIA adopts said band-stop filter feedback network, the TIA will have the following advantages:

(1). The highest work frequency of TIA has nothing to with the TIA voltage conversion gain, thus improving the current-voltage conversion gain will not be limited by the highest working frequency and signal bandwidth required like existing techniques.

(2). TIA current-voltage conversion gain does not depend on the resistance of the TIA feedback network, thus it can have high current-voltage conversion gain and use low resistance in the feedback network TIA at the same time. It can reduce resistance thermal noise that had a large proportion of TIA output noise to negligible degree.

(3). Adjust the feedback resistance value in network can adjust the frequency bandwidth of the transimpedance amplifier TIA, and keep the he current-voltage conversion gain required.

Two above advantages still exist using said multi-RLC series-parallel band-stop filter feedback network. There is no need to apply the method "that adjusting the feedback resistor value in network" to change TIA frequency bandwidth, but the method that "changing the center frequency of each RLC series-parallel bandstop filter" to change the TIA frequency bandwidth. And the method that changing TIA bandwidth can also keep the current-voltage conversion gain required.

In the following, setting the feedback network for an example to further explain the advantages of the technology of TIA. The feedback network consists of Z1, Z2 in parallel form, where Z1 is the impedance of the inductive L, Z2 is series impedance of capacitance C and resistance RC. The feedback network bandwidth WB, center frequency f0, center frequency impedance Z0 (i.e. selective frequency TIA current-voltage conversion gain at the center frequency) can be selected singly, the relations between L, C, RC in the network and the three selected parameters are:

$$L = \frac{1}{2\pi \cdot f_0} \frac{W_B}{\sqrt{f_0^2 - W_B^2}} Z_0 \quad (10)$$

$$C = \frac{1}{2\pi \cdot W_B} \frac{f_0}{\sqrt{f_0^2 - W_B^2}} \frac{1}{Z_0} \quad (11)$$

$$R_C = \left(\frac{W_B}{f_0}\right)^2 Z_0 \quad (12)$$

The existing digital closed-loop fiber optical current sensor adopted low pass TIA. In the feedback loop, feedback resistor RF is greater than or equal to TIA current-voltage conversion gain Z0. If the Z0=1 MΩ was required, RF should be greater than or equal to 1 M. For feedback network as an example, WB=10 kHz, f0=500 kHz under the common work condition, the resistor that feedback network required RC=(10/500)2Z0=4×10⁻⁴Z0=400Ω, noise output power level of the feedback network resistor was only (4×102/106) 1/2=1/50 of existing technology.

It has been proved that the technology of the invention can make the thermal noise of TIA in the output signal and the shot noise level decrease to the existing technique 1/650 below through using the transimpedance amplifier TIA. Here it further proves that, compared with the existing digital closed-loop fiber optical current sensor adopting the low-pass filter type TIA, under the same TIA current-voltage gain condition, the TIA required feedback network resistance of the present invention than the feedback resistance of the existing TIA technology is lower. Therefore, it can greatly reduce noise power level of the feedback network resistance at the TIA output end.

Figure 10:
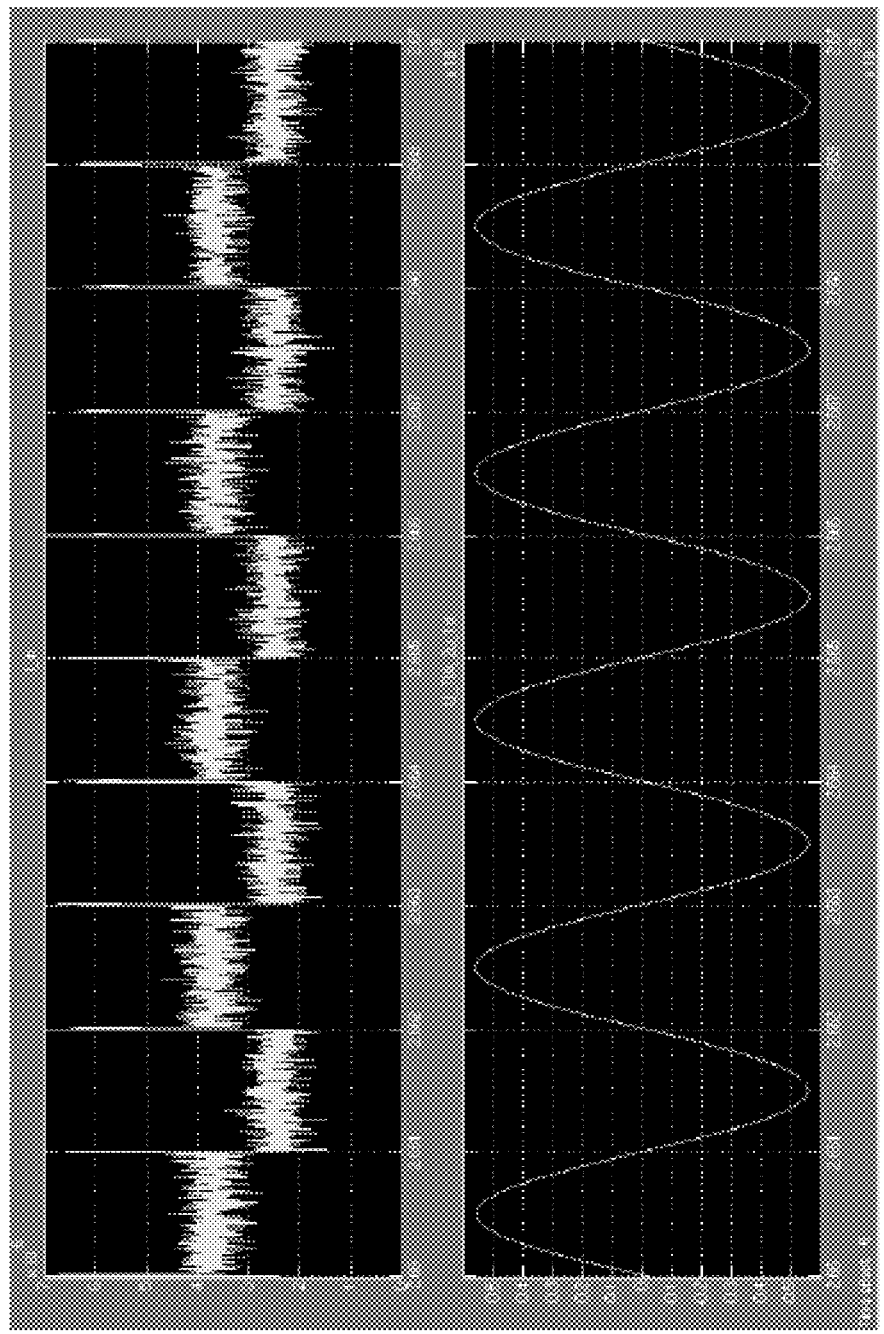
FIG. 10 is the input current waveform (above diagram) and the output voltage wave (below diagram) of the TIA which is gain through element simulation circuit of the simulation software simulink of the Matlab.

FIG. 10 is the input current waveform (above diagram) and the output voltage wave (below diagram) of the TIA that is gain through element simulation circuit of the simulation software simulink of the Matlab. It used the feedback network in FIG. 10. The period of the modulation square wave is 2 microseconds, signal frequency measured is 5 kHz, but the square wave amplitude is almost no change within 5 cycles in FIG. 10. Therefore, it can determine the instantaneous amplitude of square wave modulation by fundamental wave of the modulation square wave.

At last, in this description of the embodiments, we have detail describe the present invention according to a particular example. The detail embodiment is one example of the invention but not the only one, so the person in this field must be understand that all the alternatives and other equal and/or similar examples are all within the range of the invention and they are all consistent with the spirits of this invention, are all protected by our claims.

What is claimed is:

1. A digital closed-loop fiber optical current sensor, comprising:
    an optical path system configured to generate a modulation signal of the optical wave "phase modulator " of said fiber optical current sensor, wherein a signal processing system extracts only any harmonic wave of a photoelectric converter output modulation square;
    wherein the optical path system consists of:
    a broadband light source, an output light of a source passes through a polarizer and becomes a low coherence length of the linear polarized light;
    an integrated waveguide type optical phase modulator, its function is to adds positive, negative 90° bias phase to the existing linear polarized light, and the its period is set already, and a feedback phase opposite to existing light wave phase;
    at least one polarization-maintaining fiber delay line, and its role is to enable the linear polarized light produces required delay after passing through the delay line, to extract current information to be measured from an interferometer output signal;
    at least one wave plate, which makes two linearly polarized lights that their polarization directions are perpendicular to each other produce 90° phase difference;
    at least one single turn fiber ring or multi fiber ring surround the conductor that will transmit the measured current, its role is to enable the left, right circularly polarized light through the optical fiber ring in the measured current magnetic field generate phase difference $\theta_C$ in accordance with Faraday effect; and then convert $\theta_C$ into the difference $\theta_L$ between two linearly polarization direction perpendicular polarized lights after the left, the right circularly polarized light back through the λ/4 fiber wave plate, and the $\theta_L=\theta_C$;
    a photoelectric converter, its effect is to convert the light phase by phase modulation type optical signal affected by the $\phi_s$ $\phi_b$ and $\phi_f$ together to amplitude modulation square wave electric signal only affected by $\phi_S$, in which $\phi_S$ is the signal phase generated by the current to measure, $\phi_b$ is phase modulator generates a bias phase, and $\phi_f$ is feedback phase;
    a trans impedance amplifier TIA, its effect is covert photo detector output low signal-to-noise ratio of the weak current signal to voltage signal that drives subsequent A/D conversion circuit of high signal-to-noise ratio;
    a digital feedback phase circuit and phase of light wave feedback loop for square wave amplitude detection, square wave amplitude accumulative, and feedback stepped ramp formation mainly, its role is to offset light wave phase changes induced by the measured current;
    a modulation gain control loop, which consist of modulation gain accumulation and modulation gain calibration, its role is to adjust the gain of said light wave phase feedback loop when feedback phase flyback error occurs, to ensure the feedback phase flyback error zero;
    an integrated waveguide type optical phase modulator, its function is to add positive, negative 90° bias phase to the existing linear polarized light, and the feedback phase opposite to existing light wave phase; and
    a bias square wave forming circuit, and its role is to add positive, negative 90° bias phase period set already to existing light wave phase by the integrated waveguide type optical phase modulator, and convert the phase modulation type optical signal into the amplitude modulation square wave signal after passing through photoelectric conversion.

2. The digital closed-loop fiber optical current sensor said according to claim 1, wherein the center frequency of amplitude sine wave of transimpedance amplifier TIA output is the fundamental frequency of said modulated square wave.

3. The digital closed-loop fiber optical current sensor said according to claim 1, wherein the center frequency of amplitude sine wave of transimpedance amplifier TIA output is the harmonic frequency of said modulated square wave.

4. The digital closed-loop fiber optical current sensor according to claim 1, wherein transimpedance amplifier TIA includes a high gain amplifier A, a photoelectric converter as the main component of the input circuit, and a bandstop filter feedback network BSF; Which connects the A reverse input end and output end of aid BSF; The output signal of said TIA is removed from the output of the A, the signal can be directly used for the subsequent signal processing, also be further amplified and then carry out signal processing.

5. The closed-loop fiber optical current sensor according to claim 1, wherein transimpedance amplifier TIA band-stop filter of the feedback network is composed of the first branch 1, and the second branch 2 in parallel.

6. The digital closed-loop fiber optical current sensor said according to claim 5, wherein the first branch 1 of transimpedance amplifier TIA band-stop filter of the feedback network is composed of the resistor RL and inductance L in series, and the second branch 2 is composed of the resistor RC and capacitor C in series.

7. The digital closed-loop fiber optical current sensor said according to claim 5, wherein the first branch 1 of transimpedance amplifier TIA band-stop filter of the feedback network is composed of the resistor RL and inductance L in series, and the second branch 2 is composed of capacitor C.

8. The digital closed-loop fiber optical current sensor said according to claim 5, wherein the first branch 1 of transimpedance amplifier TIA band-stop filter of the feedback network is composed of the inductance L, and the second branch 2 is composed of capacitor C in series.

* * * * *